(12) United States Patent
Raccis

(10) Patent No.: US 10,950,775 B2
(45) Date of Patent: Mar. 16, 2021

(54) CONVERSION MATERIAL

(71) Applicants: Gerold Kotman, Leipzig (DE); Niklas Kotman, Mainz (DE); Riccardo Raccis, Cologne (DE)

(72) Inventor: Riccardo Raccis, Cologne (DE)

(73) Assignees: Gerold Kotman, Leipzig (DE); Niklas Kotman, Mainz (DE); Riccardo Raccis, Cologne (DE)

( * ) Notice: Subject to any disclaimer, the term of this patent is extended or adjusted under 35 U.S.C. 154(b) by 0 days.

(21) Appl. No.: 16/491,339

(22) PCT Filed: Mar. 9, 2018

(86) PCT No.: PCT/EP2018/055890
§ 371 (c)(1),
(2) Date: Sep. 5, 2019

(87) PCT Pub. No.: WO2018/162708
PCT Pub. Date: Sep. 13, 2018

(65) Prior Publication Data
US 2020/0035895 A1 Jan. 30, 2020

(30) Foreign Application Priority Data
Mar. 9, 2017 (EP) ...................... 17000385

(51) Int. Cl.
*H01L 35/24* (2006.01)
*C08K 3/04* (2006.01)
(Continued)

(52) U.S. Cl.
CPC .............. *H01L 35/24* (2013.01); *C08K 3/041* (2017.05); *C08K 3/042* (2017.05); *C08K 3/08* (2013.01);
(Continued)

(58) Field of Classification Search
CPC ......... H01L 35/24; H01L 35/20; H01L 35/22; H01L 35/26; H01L 37/00
See application file for complete search history.

(56) References Cited

U.S. PATENT DOCUMENTS 8,829,327 B2 9/2014 Meng et al.
2002/0198109 A1* 12/2002 Wu ..................... H01L 39/2487
505/100
(Continued)

FOREIGN PATENT DOCUMENTS

CN 103834993 A 6/2014
EP 2832689 A1 2/2015
(Continued)

OTHER PUBLICATIONS

Translation of JP Office Action received for JP Application No. 2019-549393, dated Apr. 14, 2020. 11 pages.
(Continued)

*Primary Examiner* — Marc Anthony Armand
(74) *Attorney, Agent, or Firm* — Finch & Maloney PLLC

(57) ABSTRACT

The present invention provides a conversion material including a first phase providing a matrix and a second phase comprising a nanoscale or microscale material providing electron mobility. The conversion material converts heat from a single macroscopic reservoir into voltage.

18 Claims, 2 Drawing Sheets

(51) Int. Cl.
    *C08K 3/08*     (2006.01)
    *C08L 9/00*     (2006.01)
    *C08L 33/08*     (2006.01)
    *H01L 35/20*     (2006.01)
    *H01L 35/22*     (2006.01)
    *H01L 35/26*     (2006.01)
    *H01L 37/00*     (2006.01)

(52) U.S. Cl.
    CPC ............... *C08L 9/00* (2013.01); *C08L 33/08* (2013.01); *H01L 35/20* (2013.01); *H01L 35/22* (2013.01); *H01L 35/26* (2013.01); *H01L 37/00* (2013.01); *C08K 2003/085* (2013.01); *C08K 2003/0806* (2013.01); *C08K 2003/0831* (2013.01); *C08K 2003/0856* (2013.01)

(56) References Cited

U.S. PATENT DOCUMENTS

| | | |
|---|---|---|
| 2006/0151820 A1 | 7/2006 | Duan et al. |
| 2013/0178545 A1* | 7/2013 | Marion ............... B01J 37/16 518/705 |
| 2013/0312806 A1 | 11/2013 | Carroll |
| 2014/0042373 A1 | 2/2014 | Geohegan et al. |
| 2014/0042390 A1 | 2/2014 | Gruner et al. |
| 2015/0380625 A1 | 12/2015 | Freer et al. |

FOREIGN PATENT DOCUMENTS

| | | |
|---|---|---|
| JP | 2010027895 A | 2/2010 |
| JP | 2010095688 A | 4/2010 |
| JP | 2010515227 A | 5/2010 |
| JP | 2011101047 A | 5/2011 |
| JP | 2016058475 A | 4/2016 |
| JP | 2016513369 A | 5/2016 |
| JP | 2016518707 A | 6/2016 |
| WO | 2008082609 A2 | 7/2008 |
| WO | 2010010783 A1 | 1/2010 |
| WO | 2018162708 A1 | 9/2018 |

OTHER PUBLICATIONS

International Search Report and Written Opinion received for PCT No. PCT/EP2018/055890, dated May 7, 2018. 10 pages.
Hewitt, et al., "Varying the concentration of single walled carbon nanotubes in thin film polymer composites, and its effect on thermoelectric power," Applied Physics Letters, vol. 98, No. 18, May 5, 2011. pp. 183110-1-183110-3.
Yu, et al., "Thermoelectric Behavior of Segregated-Network Polymer Nanocomposites," Nano Letters, vol. 8, No. 12, Dec. 10, 2008. pp. 4428-4432.
Translation of RU Office Action and Search Report received for RU Application No. 2019128421/28(055917). Office Action dated May 26, 2020. 6 pages.

\* cited by examiner

CONVERSION MATERIAL

This application relates to a conversion material, able to convert thermal energy into electric energy, a method of producing same and devices using same.

RELATED ART

Thermoelectric generators and thermoelectric conversion materials are known. Such materials have gained importance as a source of energy mainly in order to make use of thermal energy which otherwise would be unused and therefore wasted. One feature of these materials is that they employ a temperature differential to generate electricity.

Such materials are already known and include ceramic composites as well as intermetallic compounds. However, typically such materials are expensive and cannot be processed in an easy way, increasing manufacturing costs. Overall, the use of thermoelectric generators (TEG) therefore is not yet widespread.

Examples of such materials may comprise a composite of a polymer matrix and dispersed carbon particles, such as disclosed in NANO LETTERS, 2008, Vol. 8, No. 12, 4428-4432; APPLIED PHYSICS LETTERS 98, 183110 (2011); US 2013/0312806 A1; US 2015/0380625 A1; and US 2014/0042373 A1. Graphene powders are disclosed in EP 2 832 689 A1.

However, as waste thermal energy is available in abundance and since attempts have been made to make use of solar heat, there is a desire in the art to provide novel ways to enable the use of thermal energy to generate electricity. In this regard scientific evaluations have focused on Brownian motors, objects typically existing on a nanoscale, capable of performing work under the stimulus of thermal energy. Such Brownian motors are discussed for example in the scientific report of Lesovik et al., published on www.nature.com under the DOI: 10.1038/srep32815 (H-theorem in quantum physics), as well as in Physical Review Letters, 104, 248001 (2010) by Eshuis et al., Experimental Realization of a Rotational Ratchet in a Granular Gas. In addition, advances in material science has been made in relation with nano- and microscale materials, such as carbon nanotubes or other types of nanoobjects, such as nanorods, as well as graphene, further widening the available materials for novel types of materials. Preferably materials and compositions suitable for the application in such conversion materials, able to generate electrical energy, should be less expensive than conventional materials and should also offer simple processing pathways, facilitating the manufacture of thermoelectric devices.

SUMMARY

An object of the invention is to provide a conversion material overcoming the problems identified above, with suitable conversion performance.

The present inventor has made a thorough investigation, and as result, it was found that it is surprisingly possible to provide a novel type of conversion material based on conventional starting materials at a low cost. As the conversion material in accordance with the present invention, as further illustrated below, does not require a temperature differential, such as conventional thermoelectric conversion materials, the novel materials in accordance with the present invention are designated as igneoelectric conversion materials, as they are able to convert spatially uniform thermal energy into voltage (electrical energy). In order to properly define this effect and in order to delimit same from similar but different concepts, such as the thermoelectric effect, the term igneoelectric (igneoelectric effect, igneoelectric material, igneoelectric behavior, etc.) is used herein to describe and define the effect disclosed here and the material described and claimed herewith.

The novel concept realized by the present invention is a composite conversion material employing a conductive material (able to conduct electrons) which provides electrical connections within the conversion material. The conductive material is composed of particles, typically microscale or nanoscale materials (defined below) with an aspect ratio of above 1. The particles accordingly so have dimensions in one direction being larger than dimensions in another direction. Typical examples of suitable shapes are tubes, rods as well as flakes. Due to the specific production process as further described below, these particles form within the conversion material electrical percolation channels, comprising assembled particles which show a preferential orientation, so that structures are obtained which resemble barbed tendrils (further illustrated below) wherein the majority of the barbs points in one direction. This particular structure appears to be responsible for the surprising effect, that the igneoelectric materials as provided by the present invention enable the generation of electricity from macroscopically uniform thermal energy.

In one embodiment, there is provided a igneoelectric conversion material including a first phase providing a matrix and a second phase comprising a nanoscale or microscale material providing electron mobility, as defined in claim 1.

In another embodiment, there is provided a igneoelectric conversion element including the igneoelectric conversion material, and two electrodes.

In still another embodiment, there is provided a igneoelectric conversion module including the igneoelectric conversion element.

In still another embodiment, there is provided an igneoelectric generator including the igneoelectric conversion module.

The materials and devices as briefly described above will be illustrated in grater detail below.

In still another embodiment, there is provided a method of manufacturing a igneoelectric conversion material. The method includes providing a matrix phase in an uncured state (such as a monomer mixture prior to curing or a polymer solution prior to solidification), adding a nanoscale or microscale material providing electron mobility and solidifying the mixture while charging one side or pole of the mixture with electrons. One suitable example of such a charging is the application of a direct electric current.

According to the embodiments of the invention, it is possible to provide an igneoelectric conversion material which can be easily prepared, which enables a wide variety of application modes and provides a suitable in igneoelectric conversion performance.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

Figure 1:
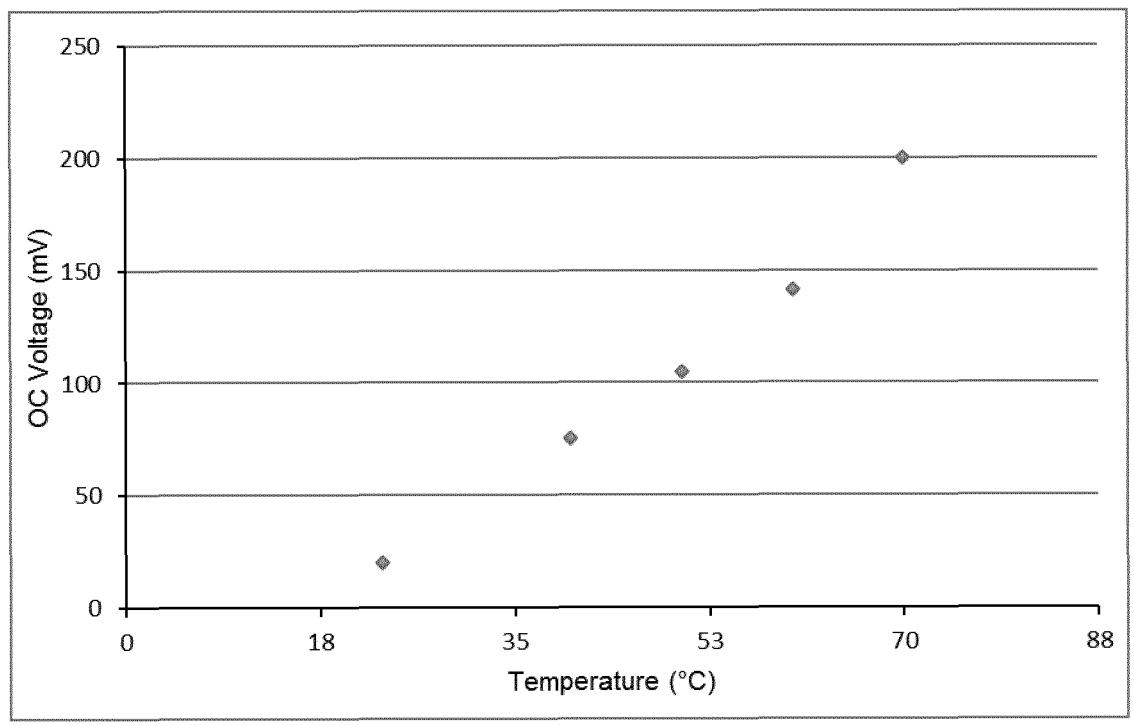
FIG. 1 shows the voltage yielded by a material in accordance with the present invention as a function of temperature.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

One part of the igneoelectric conversion material of the present invention is the first phase, i.e. the phase providing the matrix. Preferably the matrix itself is an insulator. Typical examples are polymeric materials which are commonly used in many fields of industry and which are able to provide a matrix containing dispersed therein the second phase as identified above and further explained below.

Suitable examples are acrylics, rubber materials, vinyl polymers as well as olefin polymers. The term polymer as employed herein includes homo—as well as copolymers. Any type of matrix material however may be employed in the present invention, although materials are preferred, which allow the preparation of the igneoelectric conversion material by means of the method of manufacture as explained herein. This comprises the provision of a mixture comprising the matrix material or a precursor thereof in a manner enabling admixture with the second phase as defined herein while allowing a certain mobility of the second phase prior to the solidification of the matrix phase to provide the igneoelectric conversion material.

Accordingly, preferred materials for the first phase are polymers which may be dissolved in suitable solvent as well as monomer mixtures, which solidify upon triggering a curing mechanism. As indicated above, one prominent example of such materials are acrylics, such as PMMA, which may be processed in solution, and which solidify due to evaporation of the solvent. Another valid example is the use of resins as the first phase, which solidify by crosslinking rather than by the absence of solvent. However, the present invention is not limited thereto.

The second phase to be employed in accordance with the present invention is a nanoscale or microscale material. The term nanoscale or microscale material as employed herein defines a material having dimensions of less than 1 mm, typically of less than 500 µm, and more preferably of below 250 µm. Examples thereof are dimensions in the range of below 100 µm, such as from 5 to 50 µm. As indicated above, nanoscale materials, i.e. materials having dimension of below 1 µm may also be employed. For cost reasons however it is often more convenient to employ microscale materials.

The material to be employed for the second phase is a material having an aspect ratio above 1, i.e. the particles of the material show a length (longest dimension of the particle) greater than the smallest dimension of the particle. Typical examples thereof are fibers as well as flakes, which do show a length far exceeding the thickness of the respective particle. Preferred embodiments are particles with an aspect ratio far above 1, such as from 2 to 100. The use of particles with such an aspect ratio enables the formation of barbed tendrils, as described herein.

In addition to fibers and flakes it is however also possible to employ dendritic materials, such as branched polymers, which do have side chains substantially shorter than the length of the main chain (backbone) of the polymer. Similarly, particles could be employed possessing a specific geometry (and not necessarily a specific size/aspect ratio), such as asymmetric branching or dentritic structures, in order to generate, upon self assembly, the barbed tendrils as required. However, at least for manufacturing purposes the use of particular materials is preferable, such as particles in the form of fibers and/or flakes.

The material employed for the second phase has to provide electron mobility. Accordingly, typical materials for the second phase are conducting or semiconducting materials. Examples thereof include carbon derived materials, such as graphene or carbon nanotubes, as well as metals, including gold, silver, as well as other conductive metals, such as copper or iron. The choice of material often depends from the availability of micro- or nanoscale materials having the required shape (i.e. particles with an aspect ratio above 1).

As already outlined above, a suitable way to prepare an igneoelectric conversion material of the present invention comprises the following steps:

Provision of the matrix material (or a precursor thereof);
admixing the material for the second phase with the matrix material (or precursor thereof); and
solidifying the mixture while applying a potential difference of charge carriers, such as electrons, preferably by applying a direct electric current.

As indicated above, the matrix phase is first provided in a form allowing the intimate admixture with the second phase material, while providing a certain mobility for the second phase material in the mixture. This is typically achieved by providing the matrix material in the form of a liquid, such as a solution of the matrix material or a liquid monomer. The liquid may be a viscous liquid, as long as the material for the second phase is able to move slightly within the mixture, to allow a certain orientation during the solidification as described above, preferably while applying a current. This aspect of the present invention will be described in the following by reference to the use of a direct current. It is however clear, that other means of providing a potential difference in the sense as defined herein will also be suitable to generate the effect described, namely the self assembly disclosed herein. The current applied is a direct (non alternating) electric current. At the start of the application of the electric current there may or there may not be electrical connections established within the mixture of first and second phase (in particular between the particles of the second phase). Accordingly, the initial phase of this method step can be described as providing electrons on one side of the composition. It has been found that due to the shape of the second phase as disclosed herein the provision of electrons initiates a self assembly process where particles progressively accrete to each other starting from the side being negatively charged, resulting in the formation of electrical conducting channels throughout the composition, in the form of specifically oriented particles of the second phase. As indicated above, one highly suitable matrix phase is a matrix made of acrylics, such as PMMA, which can be provided in the form of a solution in a suitable solvent.

Figure 3:
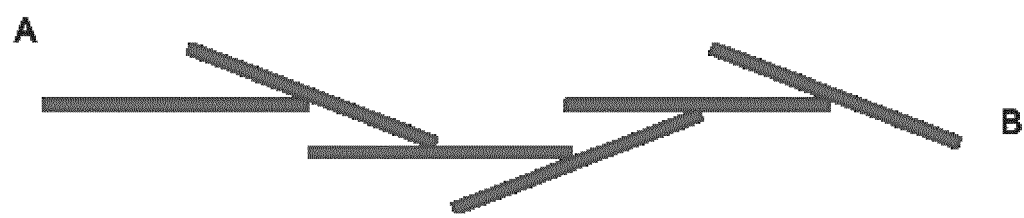
FIG. 3 shows a schematic of a section of conductive barbed tendril as present within the material.

Employing this type of process, the material for the second phase will undergo a certain degree of orientation during solidification, due to the application of the current. As the material for the second phase allows for electron movement, such as within a conductor, such as gold, or a semiconductor, such as graphene, the particles for the second phase with the aspect ratio above 1 will undergo the self assembly described at the previous paragraph, generating connections (allowing electron mobility) in the charge carrier (electron) movement direction. The result is a three dimensional assembly of the particles constituting the second phase, to form what can be described as barbed tendrils (as the particles will mainly contact each other randomly along one axis of the particles) providing a certain form of connection allowing electron movement throughout matrix, i.e. along the connected particles of the second phase. Due to this production process the barbs, as illustrated in FIG. 3, point predominantly in one direction, i.e. the direction of the applied current, i.e. opposite to the electron movement defined by the applied direct electrical current.

An advantage of the preparation of the material of the present invention in this manner is, that the admixture of first and second phase may be prepared using conventional polymer processing devices. In addition, the mixture, prior to solidification may be applied using a broad variety of conventional techniques, such as printing. This enables the provision of the final igneoelectric conversion material in a broad variety of shapes in a simple manner. It is for example possible to print thin layers of igneoelectric conversion materials, allowing the provision of large panels. Alternatively it is possible to cast the mixture prior to solidification, to prepare thicker blocks of igneoelectric conversion materials.

It has surprisingly been found and confirmed by experimental data that with an igneoelectric conversion material in accordance with the present invention it is possible to generate electricity employing a single thermal reservoir. By employing nano- or microscale materials for the second phase, and by ensuring the formation of conducting channels throughout the material, as explained above, a steady, continuous generation of electricity is enabled, provided the conversion material is within a surrounding with a temperature above a certain threshold value, despite the fact that only a single thermal reservoir is provided.

At present, the leading explanation of the igneoelectric effect is based on the fact that the predominance of barbs pointing in one direction hinders the spontaneous, thermally-mediated movement of charge carriers along the barbed tendrils in that direction, thus resulting by subtraction in a net macroscopic charge movement in the other direction. This effect occurs at the length scale in which the electric charges move in a ballistic fashion (trajectory-dependent) rather than in a Brownian fashion (trajectory-independent), and for which the barbs constitute the equivalent of blind alleys for spontaneous charge mobility.

Because the igneoelectric effect is generated locally at the length scale of ballistic movement for electric charges, the effect will be generated only around junctions between the particles constituting the second phase (see below the schematic representation of the connections (junctions) and within a distance from said junctions comparable with the length scale of ballistic movement for electric charges in the particles' material. For this reason, the effect will be more pronounced macroscopically the more the particles constituting the second phase present a typical length scale comparable with, or smaller than, the length scale of ballistic movement for electric charges in the particles' material. For instance, in Gold ballistic movement of electric charges happens over nanometric distances; in graphene, up to micrometric distances. The experimental data generated and described in the examples, show that for both cases (nanometric as well as micrometric distances) functional systems can be produced, i.e. systems where the second phase was constituted of gold nanorods and, separately, graphene microflakes.

In order to allow the function of such a conversion material it is required, that the dispersion of the second phase within the first phase is sufficient to prevent the occurrence of segments comprising bulk agglomerates of the second phase. This can typically be ensured by simply providing a thorough mixing of the two phases before solidification and adjusting the content of the second phase. The minimum amount of particles of the second phase is an amount, which provides the above described percolation channels (barbed tendrils) allowing electron mobility. This minimum content depends from the type of material employed as well as form the type of system (first and second phase) used, but can be easily established by an average skilled person by simply producing the conversion material and confirming the ability to generate electricity. This content may be for example from 0.01% by weight to not more than 70% by weight. This range however should not be construed as limiting the present invention, as other loadings may be employed. Suitable ranges may be from 0.1 to 50 wt.-%, with further examples being from 1 to 25 wt.-% or from 5 to 10 wt.-%. If required, a sufficient dispersion of the second phase in the matrix may be ensured by using surface modified particles, allowing a better dispersion of the second phase in the matrix, by using less viscous solutions of the matrix material, or by employing surface active agents/dispersants.

Analysis of igneoelectric conversion materials according to the present invention, using for example SEM, has revealed that the self assembled structure of the second phase in fact is obtained in accordance with the method described herein.

For low second phase contents in the composite, the self-assembly process yields predominantly separate tendrils in the direction A->B (charge carrier direction). In this case the self-assembly process results in what can be described as barbed tendrils, illustrated at FIG. 3.

As indicated in FIG. 3, the majority of the barbs points into one direction, i.e. in the above described case towards A. Such a structure appears to enable the igneoelectric effect provided by the present invention. At higher loadings of the second phase structures are generated which also show a certain interconnection between different tendrils, which is not detrimental to the function of the composite as long as a sufficient dispersion of the second phase is ensured. More in general, the functionality of the system is maintained as long as a sufficient degree of anisotropy is maintained in the angles between conducting segments of the second phase. In this sense, functional systems can also be constituted, partially or in full, by tendrils packed closely enough so that adjacent tendrils connect through the protruding barbs, which in this configuration function as bridges between adjacent tendrils rather than blind alleys for charge movement. In this sense the aforementioned anisotropy in angles can be obtained, for instance, via curved barbs/bridges and/or divergence/convergence in the overall direction of tendrils. In both the two additional configurations described (curved barbs/bridges and/or divergence/convergence in the overall direction of tendrils), the functionality of barbs as blind alleys for charge movement would be substituted with a non-zero contribution in one direction to spontaneous, ballistic charge movement at the two junction points between the barb and two adjacent tendrils, due to the barbs/bridges forming different angles with the tendrils.

Both the two additional configurations described (curved barbs/bridges and/or divergence/convergence in the overall direction of tendrils) can be traced back and obtained as close-packing of previously described barbed tendrils.

In specific cases, such as for high second phase contents, the barbed tendrils created by the self-assembly process described at [0024] can be affected by branching or ramifications, which can contribute to the majority of barbs/angles at the junctions to point in the opposite way to what described at and following [0024]. This can also produce a functional system, where the electrical voltage yielded by the final system is opposite to the one applied during fabrication. This inverted configuration can also be the result of specific conditions such as local heat-induced crosslinking of the first phase at the edge of accreted particles, which can lead to already accreted particles to only present their face or longer side as available point of contact for newly accreting particles. This would result in a directional reversal of the structure at FIG. 3. Such inverted systems are of course also functional.

The schematic representation in FIG. 3 also displays, that the second phase material (conductive material phase) must be present in the form of objects/particles possessing a distinct size ratio in their geometry (i.e. an aspect ratio above 1), so that they display an orientation in relation to each other and in relation to the macroscopic geometry of the material. Metals or graphene can for example be used, and the objects can range from rods to flakes, to tubes, etc. In pilot experiments, functional systems have been obtained by using gold nanorods, as well as separate systems using graphene microflakes.

Next, description will be given of a igneoelectric conversion element according to this embodiment.

The igneoelectric conversion element includes the igneoelectric conversion material and two electrodes. Details thereof will be described below.

The igneoelectric conversion element according to this embodiment includes the igneoelectric conversion material. In addition, the igneoelectric conversion element further includes a plurality of electrodes (at least anode andcathode), and if desired, additional elements, such as a cover for the igneoelectric conversion material or elements allowing the joining of a plurality of igneoelectric conversion elements. Thermal energy can be directly converted into electric energy by using the igneoelectric conversion element.

As the electrode, the igneoelectric conversion element includes a first electrode that electrically connects one end of the igneoelectric conversion material, a second electrode that is connected to the other end of the igneoelectric conversion material.

The igneoelectric conversion material and each of the electrodes may be joined through a joining member and a diffusion prevention member. The joining member and the diffusion prevention member may be provided to be laminated between the igneoelectric conversion material and the respective electrode.

Although not particularly limited, it is preferable that the electrode is composed of at least one kind of alloy that is selected from the group consisting of an Fe alloy, a Co alloy, a Ni alloy, a Cu alloy, a Ti alloy, and an Al alloy. In addition, the electrode may be at least one kind of metal that is selected from the group consisting of, for example, iron, cobalt, nickel, copper, titanium, and aluminum. In addition, as a material of the electrode, it is more preferable to use an alloy having the same composition as an alloy layer of the joining member. According to this, it is possible to enhance adhesiveness between the electrode and the joining member.

From the viewpoint of mitigating a thermal stress, it is preferable that the joining member is composed of at least one kind of alloy that is selected from the group consisting of a Cu alloy, a Ag alloy, a Au alloy, and an Al alloy.

From the viewpoint of preventing diffusion of constituent elements of the igneoelectric conversion material, it is preferable that a diffusion prevention member is provided and such a member may be composed of at least one kind of alloy selected from the group consisting of an Fe-M1 alloy (M1 represents at least one kind of element selected from the group consisting of Cr, Mo, W, V, Nb, Ta, Mn, Ti, Zr, Hf, C, Si, and Ge), a Co-M1 alloy, an Ni-M1 alloy, a Ti-M2 alloy (M2 represents at least one kind of alloy selected from the group consisting of Al, Ga, In, Cu, Ag, Au, Sn, Zn, and Mg), a Zr-M2 alloy, a Hf-M2 alloy, a V-M2 alloy, a Nb-M2 alloy, a Ta-M2 alloy, a Cr-M2 alloy, an Mo-M2 alloy, and a W-M2 alloy.

Furthermore, the joining member and the diffusion prevention member may be constituted by one kind of alloy layer, respectively, but may be constituted by two or more kinds of alloy layers, respectively.

The joining member and the diffusion prevention member can be laminated on the igneoelectric conversion material by a method such as soldering, sputtering, vapor deposition, thermal spraying, and a spark plasma sintering method.

The electrode can be laminated on the joining member by a known method such as soldering, sputtering, vapor deposition, thermal spraying, a spark plasma sintering method, and micro-laser welding.

In addition, in this embodiment, description has been given of the igneoelectric conversion element that includes the joining member and the diffusion prevention member, but any one or both of the joining member and the diffusion prevention member may be omitted.

The igneoelectric conversion element may be employed in a igneoelectric conversion module, which may be constructed in accordance with standard procedure known to the skilled person. The skilled person is also aware on how to produce an igneoelectric generator and system employing the material described herein.

The module as referred to herein typically comprises one or more of the elements as described above together with means required for controlling the performance of the element(s), as well as means for providing information about the status of the element(s), such as electricity generated etc., as well as optionally means for connecting the module to an electrical grid or a device using the electricity generated (such as lightning panes, etc.) and/or electricity storage means (battery). The generator as identified above comprises the module including the means for connecting the module to an electrical grid or a device using the electricity generated (such as lightning panes, etc.) and an electricity storage means (battery).

Due to the simple nature of the components required to produce the igneoelectric conversion material according to the present invention, and due to the ability to process and shape the material using standard procedures, the present invention allows a broad variety of potential applications. Large panels of the material may be printed, allowing for the harvesting of energy, for example to provide light, indoors in heated facilities. Such panels may also be suitable to provide electricity for light generation in southern areas, where other sources of electricity are scarce. Any type of heat recycling may be possible, even when simple patterns such as panels are not possible, as the igneoelectric conversion material according to the present invention can be easily shaped even into complex shapes, as the use of polymeric matrix materials allows post-manufacture shaping processes, such as thermoforming etc. As the materials employed for the first and second phase of the igneoelectric conversion material of the present invention are available at reasonable costs, larger arrays of panels, but also bulk composites may be employed for electricity generation in regions with available geothermal energy, or in regions with high available solar heat.

Description has been given of the igneoelectric conversion element, and the igneoelectric conversion module, but these are illustrative only, and structures thereof are not limited to the above-described structures.

Next, the operation and effect of this embodiment will be described.

The igneoelectric conversion material according to this embodiment is excellent in conversion performance. In addition, it is possible to realize a igneoelectric conversion element, a igneoelectric conversion module, a igneoelectric generator, and a igneoelectric conversion system, which are excellent in conversion performance, by using the igneoelectric conversion material according to this embodiment.

In addition, the invention is not limited to the above-described embodiment, and variations, modifications, and the like in a range capable of achieving the object of the invention are included in the invention.

EXAMPLE

Hereinafter, the invention will be described in detail with reference to an Example. Furthermore, this invention not limited to the description of Examples.

Preparation of Igneoelectric Conversion Material

Example 1

Graphene flakes, obtained by sonification of graphite in NMP, with a width of about 10 μm were admixed with a solution of PMMA in NMP. A sample with a volume of 2.5 cm³ was produced by casting the mixture into a glass mold and solidification while applying a current was carried out. The obtained sample was a conductive ohmic system, displaying an almost linear dependency between voltage and temperature applied above a threshold temperature above 20° C. (see FIG. 1). These experimental results display the general function of the igneoelectric conversion material of the present invention as single thermal reservoir. Similar samples were also prepared using gold nanorods as material for the second phase.

Electrification of the samples was done by connecting poles A and B to a High Voltage DC power supply by FuG GmbH (http://www.fug-elektronik.de/en/products/high-voltage/hcp.html). Depending on the samples, electrification was performed with initial voltage ranging from 1 to 3 kV, with corresponding currents between 0.1 and 1 mA.

The electrodes were prepared by gold-sputtering the mold with a layer of gold, after applying a mask to it in order to limit and control the areas on which the gold was to be retained. This allowed for a micrometric-thick layer of gold to be present in limited areas on the mold, specifically the areas that were to constitute poles A and B, and which both extended continuously from within the inside of the mold (where the precursor solution was later to come into contact with them) over the edge and on the outside of the mold. Aluminum foil was taped to the outside gold-sputtered surfaces corresponding to poles A and B. Finally, standard electric cables were connected to the aluminum via crocodile clamps, and this setup was used both for electrification as part of fabrication, as well as measurement of the properties of the finished prototypes.

The gold nanorods employed in the samples can be prepared using published procedures, see for example (http://www-.sciencedirect.com/science/article/pii/S0010854505000287, or can be purchased from a variety of companies such as Sigma-Aldrich (http://www.siqmaaldrich.com/technical-documents/articles/materials-science/nanomaterials/gold-nanostructures.html).

Figure 2:
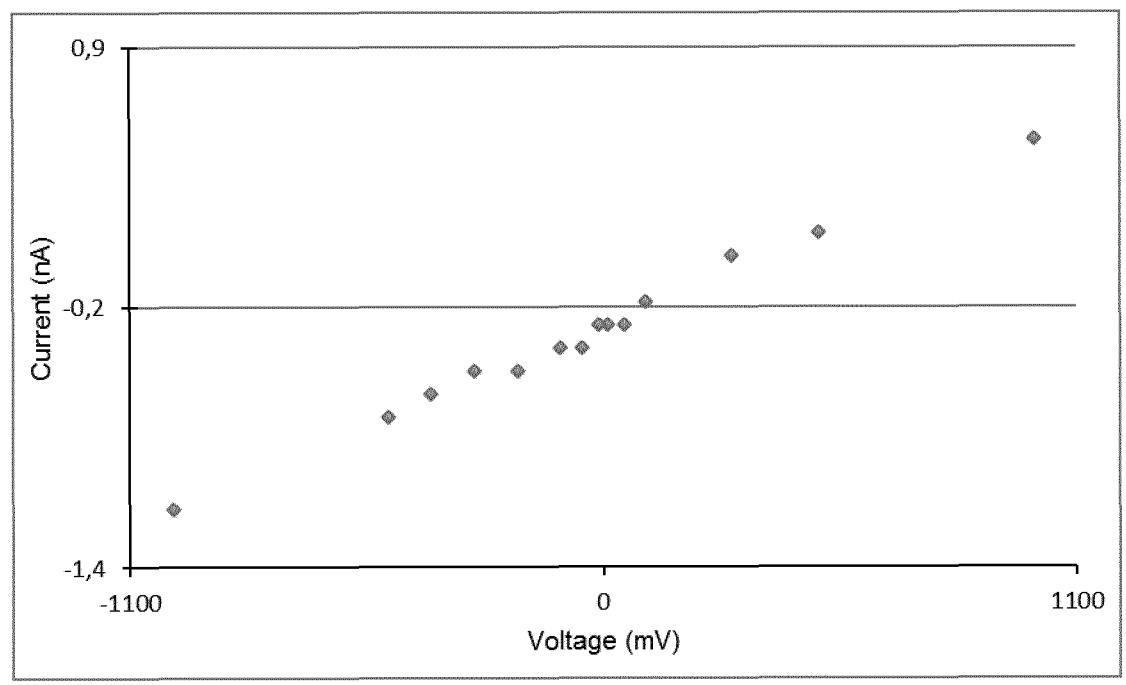
FIG. 2 shows the ohmic behavior of a material in accordance with the present invention, where the voltage is externally applied, the sample temperature is 60° C., and the offset is given by the voltage yielded by the material itself.

The analysis and evaluation of the materials as produced showed that the composites displayed the above identified igneoelectric effect. FIG. 1 shows, that a material in accordance with the present invention yields an OC voltage which increases with an increase of the temperature, confirming the possibility to harvest electricity by converting thermal energy using a single thermal reservoir. The ohmic behavior of the material is displayed in FIG. 2 (data obtained using a Keithley 2400 SourceMeter at 60° C.), confirming again the effect already displayed by FIG. 1. Both Figures do show results obtained using materials with very low loadings of second phase materials prepared using non-optimized methods. It has been shown, that by increasing the second phase loading and optimizing the production method (additional sonification steps to improve mixture of first and second phase as well as adjustment of current used during solidification) increases the conversion efficiency.

The invention claimed is:

1. A thermal energy to electrical energy conversion material comprising:
    a first phase providing a matrix; and
    a second phase comprising a nanoscale or microscale material providing electron mobility, the second phase comprising particles with an aspect ratio greater than 1,
    wherein the second phase provides electrical conducting channels throughout the conversion material wherein, and
    the second phase comprises barbed tendrils, with a majority of the barbed tendrils p pointing in one direction.

2. The conversion material according to claim 1, wherein the first phase comprises an insulator.

3. The conversion material according to claim 1, wherein the second phase comprises a semiconducting material or a conducting material.

4. The conversion material according to claim 3, wherein:
    the semiconducting material is selected from carbon nanotubes and graphene; and
    the conducting material is selected from a material in which charge carriers move freely within a stationary structure.

5. The conversion material according to claim 1, wherein the first phase comprises a non-conductive polymer.

6. The conversion material according to claim 1, wherein the second phase comprises particles with a dimension of 100 μm or less.

7. The conversion material according to claim 5 comprising a matrix of an acrylic polymer and a second phase of graphene flakes dispersed therein.

8. A conversion element, comprising:
    the conversion material according to claim 1; and
    two electrodes connected to the conversion element.

9. A conversion module, comprising:
    the conversion element according to claim 8.

10. A generator, comprising: the conversion element according to claim 8.

11. A method of manufacturing a conversion material comprising:

preparing a liquid precursor of a first phase;
admixing a material for a second phase with the liquid precursor of the first phase, the admixing forming a mixture; and
solidifying the mixture of the first phase and the second phase,
wherein the solidifying comprises applying a direct current to the mixture of the first phase and the second phase during the solidification.

12. The method of manufacturing the conversion material according to claim 11, wherein a weight content of the material of the second phase is from 0.01 weight % to not more than 70 weight % of the total weight of the conversion material.

13. The conversion material according to claim 2, wherein the insulator is a polymer.

14. The conversion material according to claim 5, wherein the non-conductive polymer comprises an acrylic polymer.

15. The conversion material according to claim 4, wherein the conducting material comprises conjugated polymers.

16. The conversion material according to claim 4, wherein the conducting material comprises a metal.

17. The conversion material of claim 16, wherein the metal is one or more of gold, silver, iron or copper.

18. The conversion material of claim 7 wherein the second phase comprises graphene flakes dispersed in the first phase.

\* \* \* \* \*